US010082665B2

(12) United States Patent
Hou et al.

(10) Patent No.: US 10,082,665 B2
(45) Date of Patent: Sep. 25, 2018

(54) DMD ASSEMBLY, DLP OPTICAL ENGINE AND DLP PROJECTION DEVICE

(71) Applicant: Hisense Co., Ltd., Qingdao (CN)

(72) Inventors: Naiwen Hou, Qingdao (CN); Xintuan Tian, Qingdao (CN); Changming Yang, Qingdao (CN)

(73) Assignees: HISENSE CO., LTD., Qingdao (CN); HISENSE USA CORPORATION, Suwanee, GA (US); HISENSE INTERNATIONAL CO., LTD., Qingdao (CN)

( * ) Notice: Subject to any disclaimer, the term of this patent is extended or adjusted under 35 U.S.C. 154(b) by 0 days.

(21) Appl. No.: 15/600,950

(22) Filed: May 22, 2017

(65) Prior Publication Data

US 2017/0255006 A1   Sep. 7, 2017

(30) Foreign Application Priority Data

Oct. 31, 2016 (CN) .......................... 2016 1 0930022
Oct. 31, 2016 (CN) .......................... 2016 1 0932606

(51) Int. Cl.
*G03B 21/16* (2006.01)
*H04N 9/31* (2006.01)
(Continued)

(52) U.S. Cl.
CPC ......... *G02B 26/0833* (2013.01); *G02B 7/003* (2013.01); *G03B 21/008* (2013.01);
(Continued)

(58) Field of Classification Search
CPC .................. H04N 9/3144; G03B 21/16; H01L 2924/0002; H01L 2924/00;
(Continued)

(56) References Cited

U.S. PATENT DOCUMENTS 4,182,559 A   1/1980 Driscoll et al.
6,056,407 A   5/2000 Iinuma et al.
(Continued)

FOREIGN PATENT DOCUMENTS

CN   2606906   3/2004
CN   2618335   5/2004
(Continued)

*Primary Examiner* — Bao-Luan Le (74) *Attorney, Agent, or Firm* — Harness, Dickey & Pierce, P.L.C.

(57) ABSTRACT

The present disclosure relates to the field of optical and projecting technology, and particularly to a DMD assembly, DLP optical engine and DLP projection device. The DMD assembly includes a base, a driver board, a chip substrate with a DMD chip and a fixing frame, where a first side of the base is provided with a mounting groove for mounting the chip substrate, a second side of the base is attached to the driver board, and the first side is opposite to the second side; a conductive spring leaf on the base extends through a bottom of the mounting groove and is beyond the second side, so that the chip substrate is electrically connected to the driver board through the conductive spring leaf; the driver board is provided with a first through hole, and the fixing frame is provided with a second through hole; position of the first hole corresponds to position of the second hole, and the driver board and the fixing frame are fixed by a fastener extending through the first through hole and the second through hole; and the fixing frame is provided with an inserting hole, into which the base is inserted.

19 Claims, 10 Drawing Sheets

(51) Int. Cl.
   *H01L 23/40* (2006.01)
   *G02B 26/08* (2006.01)
   *G03B 21/00* (2006.01)
   *G03B 21/14* (2006.01)
   *G02B 7/00* (2006.01)

(52) U.S. Cl.
   CPC ........ G03B 21/145 (2013.01); H01L 23/4006 (2013.01); H04N 9/315 (2013.01); H04N 9/3114 (2013.01); *H01L 2023/405* (2013.01); *H01L 2023/4056* (2013.01); *H01L 2023/4081* (2013.01); *H01L 2023/4087* (2013.01)

(58) Field of Classification Search
   CPC ....... H01L 2023/405; H01L 2023/4056; H01L 2023/4081; H01L 2023/4087; H01L 23/4006; H01L 2924/3011
   See application file for complete search history.

(56) References Cited

U.S. PATENT DOCUMENTS

| | | | |
|---|---|---|---|
| 6,477,058 B1 | 11/2002 | Luebs et al. | |
| 6,545,879 B1 | 4/2003 | Goodwin | |
| 6,733,141 B2* | 5/2004 | Lee | G02B 7/003 349/58 |
| 6,791,838 B1* | 9/2004 | Hung | H01L 23/4006 165/185 |
| 7,275,833 B2* | 10/2007 | Saito | H01L 23/4006 257/E23.084 |
| 7,557,867 B2* | 7/2009 | Goo | H04N 5/7458 348/787 |
| 7,612,440 B2* | 11/2009 | Rancuret | H01L 23/4006 257/678 |
| 7,660,124 B2* | 2/2010 | Chen | H05K 7/20472 165/80.3 |
| 7,847,381 B2* | 12/2010 | Rancuret | H01L 23/4006 257/678 |
| 7,952,178 B2* | 5/2011 | Rancuret | H01L 23/4006 257/678 |
| 7,999,773 B2* | 8/2011 | Moon | G03B 21/005 345/108 |
| 8,147,072 B2* | 4/2012 | Lin | G03B 21/16 353/52 |
| 9,470,918 B2* | 10/2016 | Aikoh | G02F 1/133308 |
| 2003/0051357 A1* | 3/2003 | Lee | G02B 7/003 33/320 |
| 2004/0150798 A1* | 8/2004 | Tsao | G03B 21/008 353/75 |
| 2004/0150898 A1* | 8/2004 | Ho | G02B 7/004 359/811 |
| 2004/0174679 A1* | 9/2004 | Hung | H01L 23/4006 361/704 |
| 2005/0265001 A1* | 12/2005 | Saito | H01L 23/4006 361/710 |
| 2006/0176453 A1* | 8/2006 | Miyamoto | G03B 21/16 353/119 |
| 2006/0227514 A1* | 10/2006 | Kang | H04N 5/7458 361/719 |
| 2006/0261457 A1* | 11/2006 | Rancuret | H01L 23/4006 257/679 |
| 2007/0126997 A1* | 6/2007 | Kang | G03B 21/008 353/99 |
| 2007/0281501 A1* | 12/2007 | Ju | H01R 13/2435 439/66 |
| 2008/0043439 A1* | 2/2008 | Lin | G03B 21/16 361/700 |
| 2010/0019366 A1* | 1/2010 | Rancuret | H01L 23/4006 257/678 |
| 2011/0057303 A1* | 3/2011 | Rancuret | H01L 23/4006 257/697 |
| 2013/0057787 A1* | 3/2013 | Aikoh | G02F 1/133308 349/8 |
| 2016/0360168 A1* | 12/2016 | Aikoh | G02F 1/133308 |
| 2017/0272711 A1* | 9/2017 | Mikawa | H04N 9/3144 |

FOREIGN PATENT DOCUMENTS

| | | |
|---|---|---|
| CN | 1696817 | 11/2005 |
| CN | 1705111 | 12/2005 |
| CN | 101221347 | 7/2008 |
| CN | 201252195 | 6/2009 |
| CN | 102243350 | 11/2011 |
| CN | 202443159 | 9/2012 |
| CN | 202904204 | 4/2013 |
| CN | 105372911 | 3/2016 |
| CN | 205665462 | 10/2016 |
| JP | 07191235 | 7/1995 |
| WO | 9928037 | 6/1999 |

\* cited by examiner

DMD ASSEMBLY, DLP OPTICAL ENGINE AND DLP PROJECTION DEVICE

CROSS-REFERENCE TO RELATED APPLICATIONS

This application claims the benefit and priority of Chinese Patent Application No. 201610930022.7, filed Oct. 31, 2016 and Chinese Patent Applicant No. 201610932606.8 filed on Oct. 31, 2016. The entire disclosures of each of the above applications are incorporated herein by reference.

FIELD

The present disclosure relates to the field of optical and projecting technology, and particularly to a DMD assembly, DLP optical engine and DLP projection device.

BACKGROUND

This section provides background information related to the present disclosure which is not necessarily prior art.

Because a digital light processing (DLP) projector is characterized by a high primary contrast, machine miniaturization and closed optical path, it is favored by users, and a DLP projector adopts a projecting technology where a digital micro-mirror device (DMD) chip acts as an imaging device to project an image by adjusting reflected light.

Figure 1:
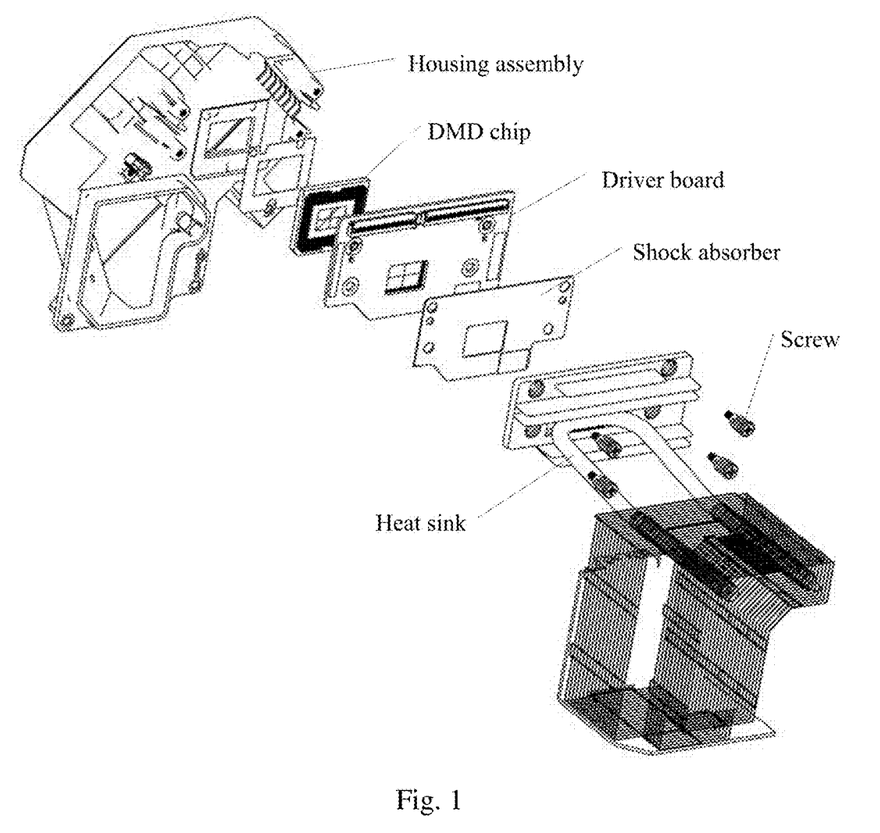
FIG. 1 is a schematic diagram of a dismantled structure of a DMD assembly according to related art.
Figure 2:
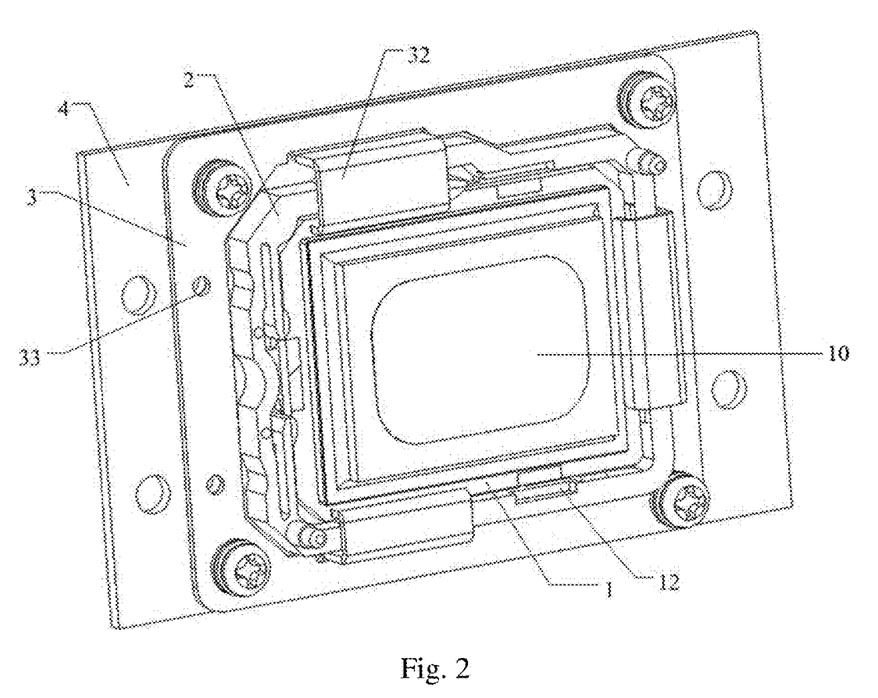
FIG. 2 is a structural schematic diagram of a DMD assembly according to a typical embodiment of the present disclosure.
Figure 3:
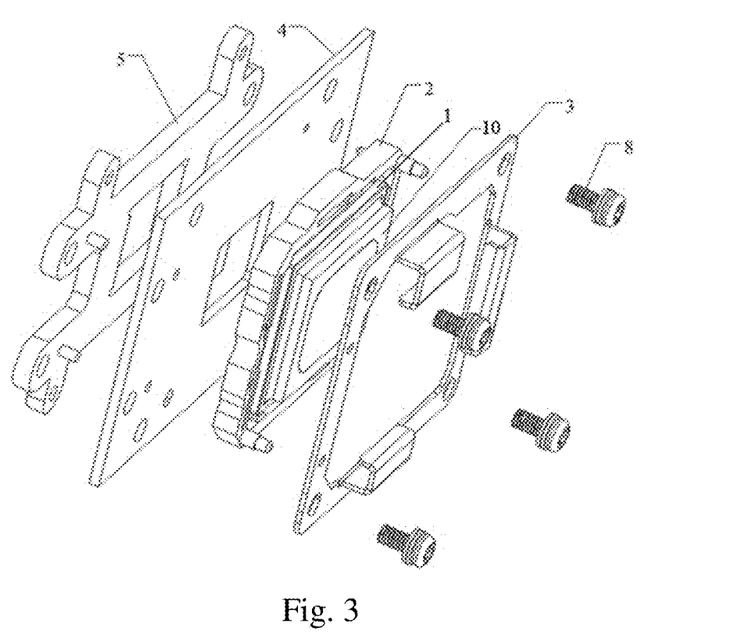
FIG. 3 is a schematic diagram of a dismantled structure of the DMD assembly illustrated in FIG. 2.

In related art, a DMD is connected to a driver board through multiple contacts. As shown in FIG. 1, a conventional connection between a DMD chip and a driver board is achieved by means of screws screwing the driver board to make the driver board press against corresponding contacts on the DMD chip.

SUMMARY

This section provides a general summary of the disclosure, and is not a comprehensive disclosure of its full scope or all of its features.

Embodiments of the disclosure provide a DMD assembly. The DMD assembly includes a base, a driver board, a chip substrate with a DMD chip and a fixing frame, wherein a first side of the base is provided with a mounting groove configured to mount the chip substrate, a second side of the base is attached to the driver board, and the first side is opposite to the second side;

the base is provided with conductive spring leaves which extend through a bottom of the mounting groove and are beyond the second side, so that the chip substrate is electrically connected to the driver board through the conductive spring leaves;

the driver board is provided with a first through hole, and the fixing frame is provided with a second through hole; position of the first through hole corresponds to position of the second through hole, and the driver board and the fixing frame are fixed together by a fastener extending through the first through hole and the second through hole; and the fixing frame is provided with an inserting hole, into which the base is inserted.

Embodiments of the disclosure also provide a DLP projection device. The device includes a DMD assembly. The DMD assembly includes a base, a driver board, a chip substrate with a DMD assembly, wherein the DMD assembly includes a base, a driver board, a chip substrate with a DMD chip, and a fixing frame, a first side of the base is provided with a mounting groove for mounting the chip substrate, a second side of the base is attached to the driver board and the first side is opposite to the second side;

the base is provided with a conductive spring leaf, which extends through a bottom of the mounting groove and is beyond the second side, so that the chip substrate is electrically connected to the driver board through the conductive spring leaf;

the driver board is provided with a first through hole, and the fixing frame is provided with a second through hole; position of the first through hole corresponds to position of the second through hole, and the driver board and the fixing frame are fixed by a fastener extending through the first through hole and the second through hole; and the fixing frame is provided with an inserting hole, into which the base is inserted.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts or features throughout the several views of the drawings.

DETAILED DESCRIPTION

Example embodiments will now be described more fully with reference to the accompanying drawings.

Because in related art, the DMD chip is solely screwed to the driver board, and the contact between the DMD chip and the driver board is decided by the screwing of the screws, in this way the contacts between the DMD chip and the driver board are prone to displacement and separation due to other components or external factors, causing inaccurate and unsteady contact between the DMD chip and the driver board, which further results in quality problems of projected images.

Moreover, the related art also has the following problems:

1. as there should be an one-to-one match between each contact on the driver board and each contact on the DMD chip, but it is difficult to ensure precision, it is very likely that a contact on the driver boards does not fit a contact on the DMD chip, and high accuracy of relevant structural parts' sizes and installation is required;

2. the contacts on the driver broad and the contacts on the DMD chip should be firmly contacted with each other, but since it is difficult to ensure flatness of the DMD chip, uneven pressing forces might be caused, which further leads to poor contact between some contacts on the driver board and their corresponding contacts on the DMD chip; also, because of the great volume and weight of a rear heat sink, there is only a gap reserved to be filled with conductive gel between a protruding cooling block of the heat sink and the back of the DMD chip, the cooling block is prone to push the DMD chip under influences of forces from the heat sink or another element, leading to poor contact caused by separation of contacts on the DMD chip and contacts on the driver board, which further results in a dark area of a projected image, in other words, the projected image cannot be displayed normally, and repeated debug by a production-line work is required;

3. since the driver board is screwed to the DMD chip, axial displacement between the DMD chip and the driver board is prone to occur during a drop test and a vibration test, leading to low stability of contact;

4. the DVD chip and the driver board are not relatively fixed, bringing inconvenience to their assembly and dismantlement.

Therefore, it is necessary to improve the way how the DMD chip and the driver board are fixed together, so as to overcome the drawbacks and shortcomings of the foregoing related art. The present disclosure would be further described with reference to the figures and exemplary embodiments, where elements that are identical bear the same reference sign in all the figures. In addition, if detailed account of known art is unnecessary for showing characteristics of the present disclosure, it is omitted.

FIG. 2-10 illustrate schematic structural diagrams of a typical embodiment of a DMD assembly according to embodiments of the present disclosure, where the DMD assembly includes a chip substrate 1 with a DMD chip 10, a base 2 for installing the chip substrate 1, a mounting plate 5 and a fixing frame 3 both for fixing a driver board 4.

The chip substrate 1 is designed to be install into a mounting groove 22 set on the base 2, where the mounting groove 22 has an elastic stopper portion 23 configured to install and fix the chip substrate 1 within the mounting groove 22, the elastic stopper portion 23 preferably is made of plastic materials and is hook-like in shape, and a plurality of elastic stopper portions 23 are provided on the edges of the interior surface of the mounting groove 22, able to confine and fix the position of the chip substrate 1 which received by the mounting groove 22, making the chip substrate 1 unlikely to be released from the mounting groove 22. There are also a plurality of conductive spring leaves (without reference signs, and referring to the dots illustrated in FIG. 5) in the mounting groove 22, the arrangement of the conductive spring leaves corresponds to the arrangement of pin of bonding pads on the chip substrate. The conductive spring leaves extends from the plane where the mounting groove 22 is to the installed driver board 4 and the installed chip substrate 1 ("installed" refers to the structure of the DMD assembly illustrated in FIG. 2), so as to make an electrical connection between the chip substrate 1 and the driver board 4 situated on opposite sides of the base 2, where the position of each conductive spring leaf on the base 2 is pre-set according to positions of contacts on the chip substrate 1 and on the driver board 4. Moreover, a plurality of locating columns 24 are provided on a side of the base 2 which presses against the driver board 4 (i.e. the side opposite to the mounting groove 22), to facilitate accurate locating during installation of the driver board 4. A plurality of locating holes 42 matching the multiple locating columns 24 are provided at corresponding positions on the driver board 4. A locating structure constituted by the locating columns 24 and the locating holes 42 is not only able to better confine relative installation positions of the driver board 4 and the base 2, but is also able to guide the installation better, avoiding wrong locating of each contact, ensuring precise contact between each contact on the driver board 4 and each contact on the chip substrate 1, and the locating structure also facilitates the fixing of the driver board 4 to the base 2.

Figure 6:
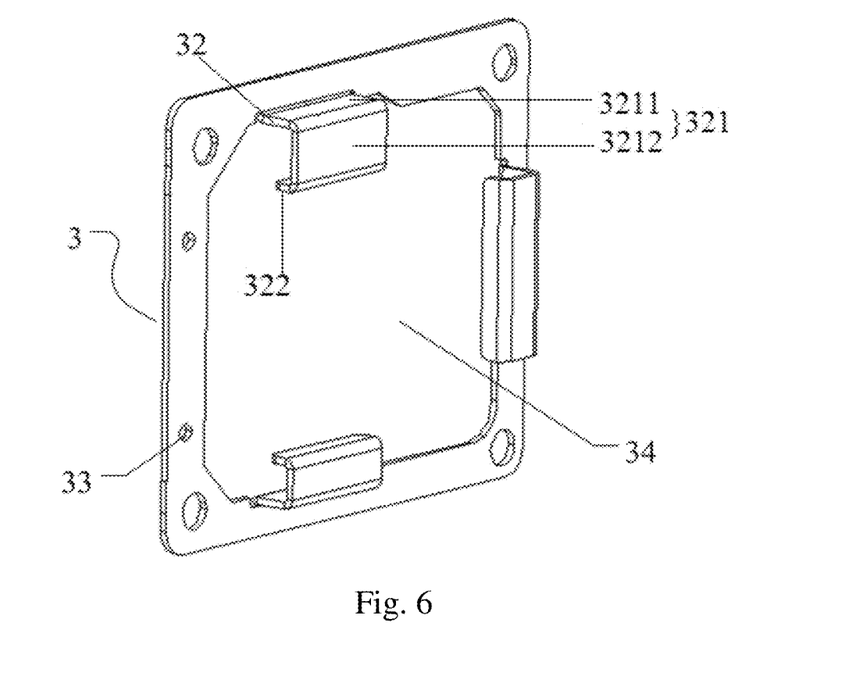
FIG. 6 is a structural schematic diagram of a fixing frame in the DMD assembly illustrated in FIG. 2.

The fixing frame 3 includes an inserting hole 34 where the base 2 is inserted. The shape of the inserting hole 34 matches the shape of the base 2 correspondingly. A plurality of elastic protrusion 32 are provided on edges enclosing a side of the inserting hole 34 (the side opposite to the side from which the base 2 is inserted/removed, i.e. the side of the fixing frame away from the driver board). Once the base 2 containing the chip substrate 1 is inserted into the hole 34 from the insertion side, each elastic protrusion 32 would hook interior surface of an edge of the mounting groove 22, engaging the elastic protrusion 32 and the edge of the mounting groove 22, and making the elastic protrusions 32 pressing against edges of the chip substrate 1 firmly, wherein the interior surface corresponds to the elastic protrusion 32.

The elastic protrusion 32 includes a fixing portion 321 connected to the fixing frame 3, and a pressing portion 322 on the fixing frame 321, where the surface of the pressing portion facing the chip substrate 1 of the pressing portion contacts the chip substrate 1, so as to press the chip substrate 1 firmly onto the base 2; the surface of the pressing portion 322 facing the mounting groove's side surface contacts the mounting groove's side surface, so as to cooperate with the inserting hole to confine the position of the base 2.

The fixing portion 321 includes a supporting portion 3211 perpendicular to the fixing frame 3 and a turning portion 3212 on the supporting 3211, extending to the inserting hole. The fixing portion 322 is on the side of the turning portion 3212 facing the driver board 4.

Alternatively, the fixing frame 3 is made of 0.8~1 mm thick SECC sheet metals, and the fixing frame 3 is integrally molded with the three elastic protrusions 32; because the SECC material has a certain degree of elasticity, the elastic protrusions 32 would not crush or damage ceramic parts on the edges of the DMD chip 10 when contacting edges of the chip substrate 1, not only the hook-like elastic protrusions 32 could hook interior surface on the edges of the mounting groove 22, but there is interference contact between the elastic protrusions 32 and surfaces of ceramic parts on edges of the DMD chip 10 (i.e. there is interference contact between surfaces of the pressing portions facing the chip substrate and surfaces of ceramic parts on edges of the DMD chip 10) as well, and the interference is approximately 0.3 mm, so that the elastic protrusions 32 could be slightly deformed when contacting the ceramic parts on the edges of the DMD chip 10, pressing the DMD chip 10 firmly, making it difficult for the DMD chip 10 to shake and shift, further ensuring precise and stable contact between contacts on the DMD chip 10 and the contacts on the driver board 4.

Figure 7:
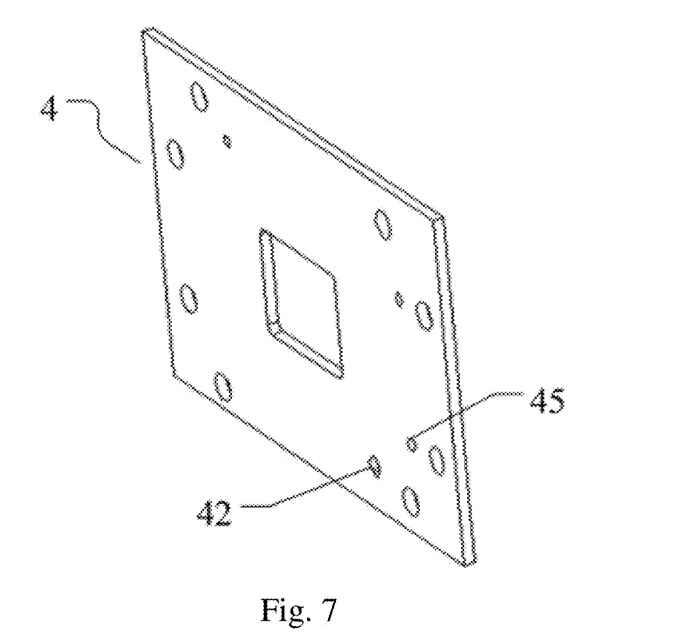
FIG. 7 is a structural schematic diagram of the driver board part (whose structure could also extend around) in the DMD assembly illustrated in FIG. 2.
Figure 8:
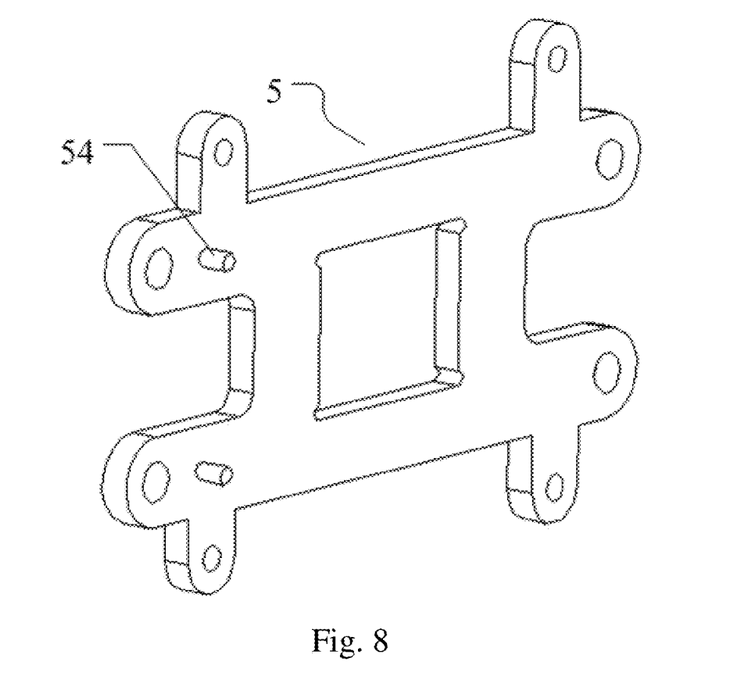
FIG. 8 is a structural schematic diagram of a mounting plate in the DMD assembly illustrated in FIG. 2.

In some embodiments, a first through hole is provided on the driver board 4, and a second through hole is provided on the fixing frame 3, where the first through hole's position corresponds to the second through hole's position, and the driver board 4 is fixed to the fixing frame 3 by a fastener (such as a bolt, a nut etc.) through the first through hole and the second through hole In some embodiments, because threaded holes cannot be made onto the driver board 4, but the driver board 4 needs to be well fixed to the chip substrate 1, the mounting plate 5 could be configured to cooperate with the fixing frame 3 to fix the driver board 4, that is, there is a third through hole (such as a threaded hole) on the mounting plate 5, and the position of the third through hole corresponds to the position of the first hole, thus steadily fixing positions of the driver board 4 and the chip substrate 1 inserted in the fixing frame 3, by screwing a fixing screw 8 into the threaded hole on the mounting plate 5 through the fixing frame 3 (the second through hole) and the driver board 4 (the first through hole). In this way, not only relative positions of the driver board 4 and the chip substrate 1 are steadily fixed, but, as the mounting plate 5 and the fixing frame 3 are situated on opposite sides of the driver board 4 respectively, forces exerted on the opposite sides of the driver board 4 could be well balanced as well, avoiding deformation of the driver board 4 and displacement of contacts on the driver board 4, and ensuring precise and steady contact between contacts on the chip substrate 1 and contacts on the driver board 4.

Moreover, a plurality of locating columns 54 are provided on the side of the mounting plate 5 which presses the driver board 4 to facilitate accurate locating during installation of the driver board 4, and a plurality of locating holes 45 matching the multiple locating columns 54 are provided on corresponding positions of the driver board 4. Similarly, a plurality of locating holes 33 matching the locating columns 54 are provided on corresponding positions of the fixing frame 3, a locating structure constituted by the locating columns 54, the locating holes 45 and the locating holes 33 has a similar effect to the abovementioned locating structure between the base 2 and the driver board 4. Alternatively, the mounting plate 5 is made of 2.5 mm thick aluminum alloy die casting, and 4 fixing screws 8 of M3×6 mm, evenly distributed, are used to screw the mounting plate 5, the driver board 4 and the fixing frame 3 together, in which way pressures applied to the driving board 4 and the chip substrate 1 are made even, avoiding poor contact of contacts.

Alternatively, assembly of each relevant element of the DMD assembly is described as follows.

Figure 4:
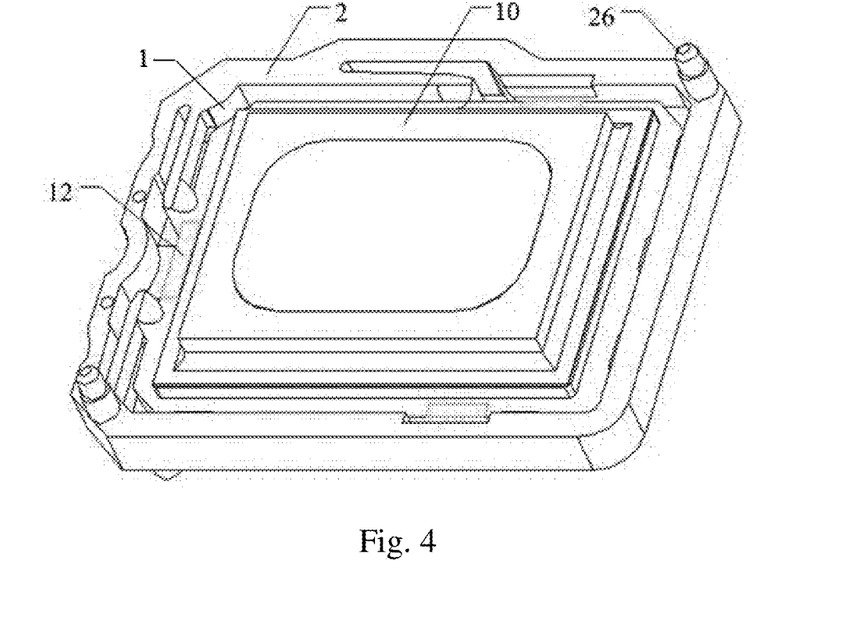
FIG. 4 is a structural schematic diagram of an assembly of a base and a chip substrate with a DMD chip in the DMD assembly illustrated in FIG. 2.
Figure 5:
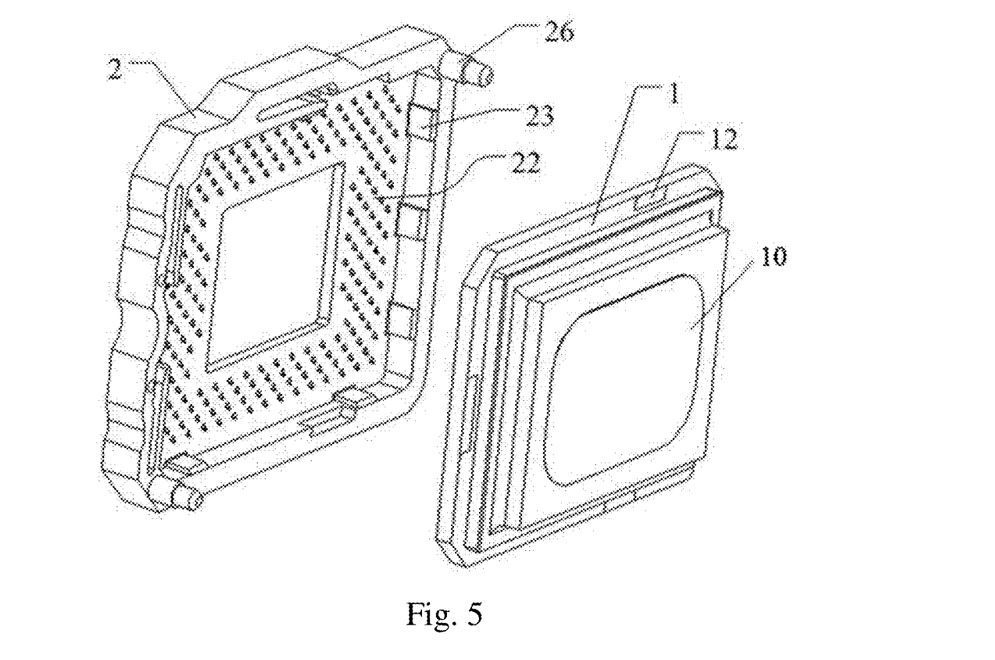
FIG. 5 is a schematic diagram of a dismantled structure of the assembly illustrated in FIG. 4.

First, fitting the chip substrate 1 to the mounting groove 22 of the base 2, where when fitting the chip substrate 1, the elastic stopper portion 23 on the edges of the interior surface of the mounting groove 22 would fix and confine the position of the chip substrate 1 well, each conductive spring leaf in the mounting groove 22 would contact a corresponding position on the chip substrate 1 precisely and steadily.

Then, insert the base 2 containing the chip substrate 1 to the inserting hole 34 on the fixing frame 3, with the side of the base 2 which receives the chip substrate 1 protruding from the side of fixing frame 3 with elastic protrusions 32, so that each elastic protrusion 32 is caught between the interior surface of an edge of the DMD chip 10 and the interior surface of an edge of the mounting groove 2 corresponding to the elastic protrusion, respectively, and hooks the interior surface the edge of the mounting groove 2, where each elastic protrusion 32 contacts and presses an edge of the DMD chip 10, making each elastic protrusion 32 slightly deformed to better press and fix the DMD chip 10, so that the DMD chip 10 is electrically connected to the driver board 4 through the conductive spring leaves in a precise and stable manner.

Figure 9:
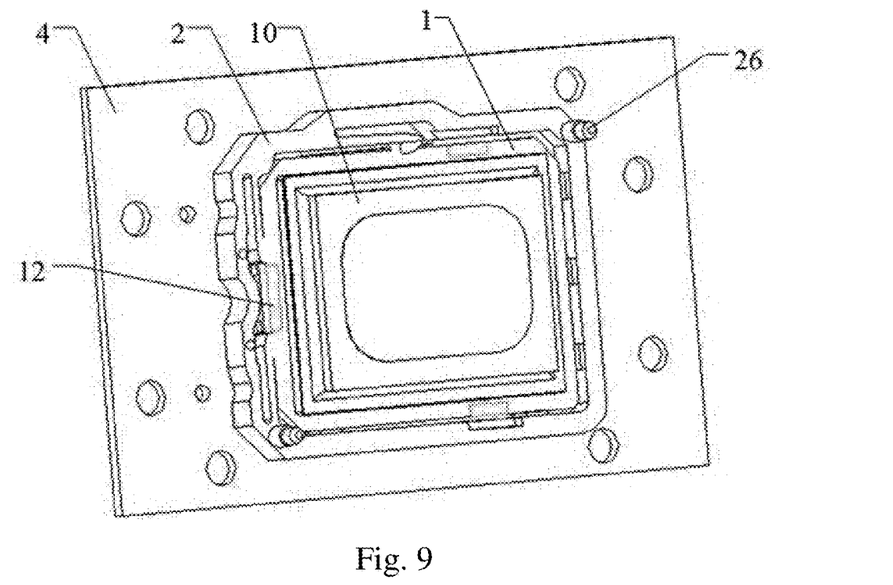
FIG. 9 is a structural schematic diagram of an assembly of a DMD chip substrate, a base and a driver board in the DMD assembly illustrated in FIG. 2.
Figure 10:
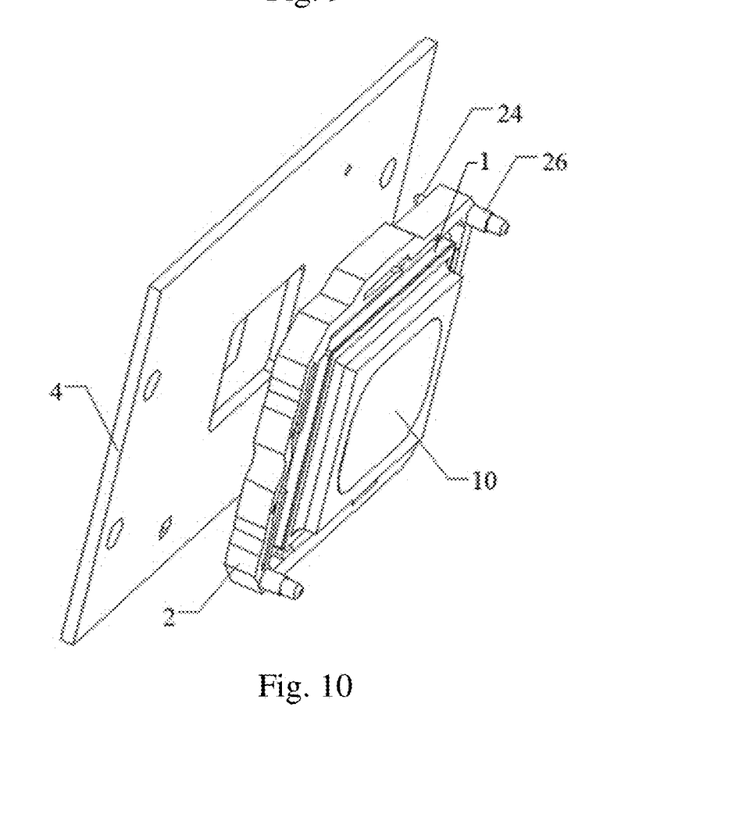
FIG. 10 is a schematic diagram of a partly dismantled structure of the assembly illustrated in FIG. 9.

Then, under the guidance of the locating columns 24 on the base 2, pressing the driver board 4 firmly against the back of the base 2 (which is opposite to the side receiving the chip substrate 1), so that each contact of the driver board 4 contacts each conductive spring leaf extending from the mounting groove 22 correspondingly, as a result, each contact of the chip substrate 1 corresponds to each contact of the driver board 4 in a one-to-one match; subsequently, fitting locating columns 54 on the mounting plate 5 into corresponding locating holes 45 on the driver board 4 and locating holes 33 on the fixing frame 33, and pressing the mounting plate 5 firmly against the driver board 4, after which, screwing 4 fixing screws 8 into threaded holes on the mounting plate 5 through the fixing frame 3 and the driver board 4, so that relevant elements closely contact one another, which further leads to stable fixing and contact between elements, especially precise and stable contact between each contact on the chip substrate 1 and each contact on the driver board 4.

Moreover, FIG. 2-15 illustrates a DMD assembly according to another embodiment of the present disclosure, where based on the DMD assembly according to the foregoing embodiment, this embodiment adds a heat sink 7 to cool the chip substrate 1 and a heat sink connection plate 6 inserted into the chip substrate 1.

Figure 14:
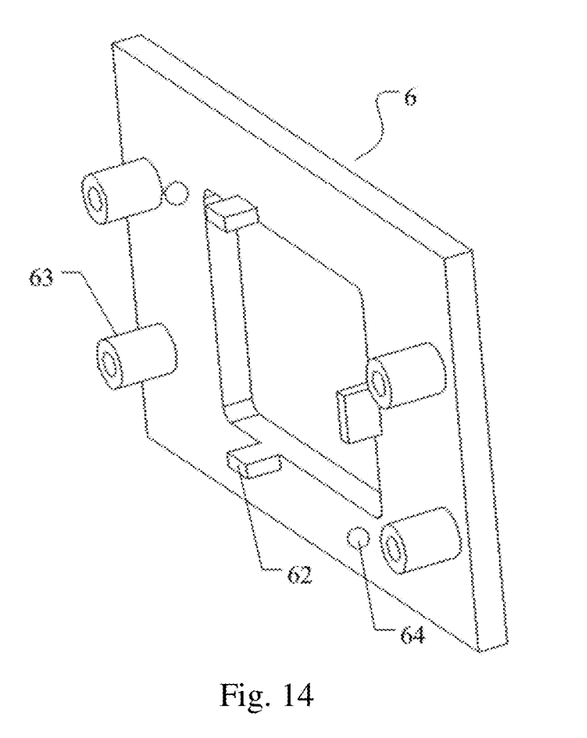
FIG. 14 is a structural schematic diagram of a heat sink connection plate in the DMD assembly illustrated in FIG. 11.

Alternatively, an inserting dowel 62 is provided on the heat sink connection plate 6, and an inserting slot 12 matching the inserting dowel 62 is provided on the chip substrate 1. The inserting slot 12 is on the ceramic part of an edge of the chip substrate 1; the inserting slot 12 and portions of the edge which contact the elastic protrusions are staggered with each other. When the inserting dowel 62 inserts into the inserting slot 12, it presses the ceramic part of the chip substrate 1 to form a hard contact. A locating column 26 is provided on the side of the base 2 with the mounting groove 22 to facilitate locating during installation of the heat sink connection plate 6. A locating hole 64 matching the locating column 64 is provided on the heat sink connection plate 6, and a locating structure constituted by the locating column 26 and the locating hole 64 has a similar effect to the abovementioned locating structures (such as the locating structure between the base 2 and the driver board 4). Alternatively, there are three sets of inserting dowels 62 and inserting slots 12 and the heat sink connection plate 6 is made of aluminum alloy.

Figure 15:
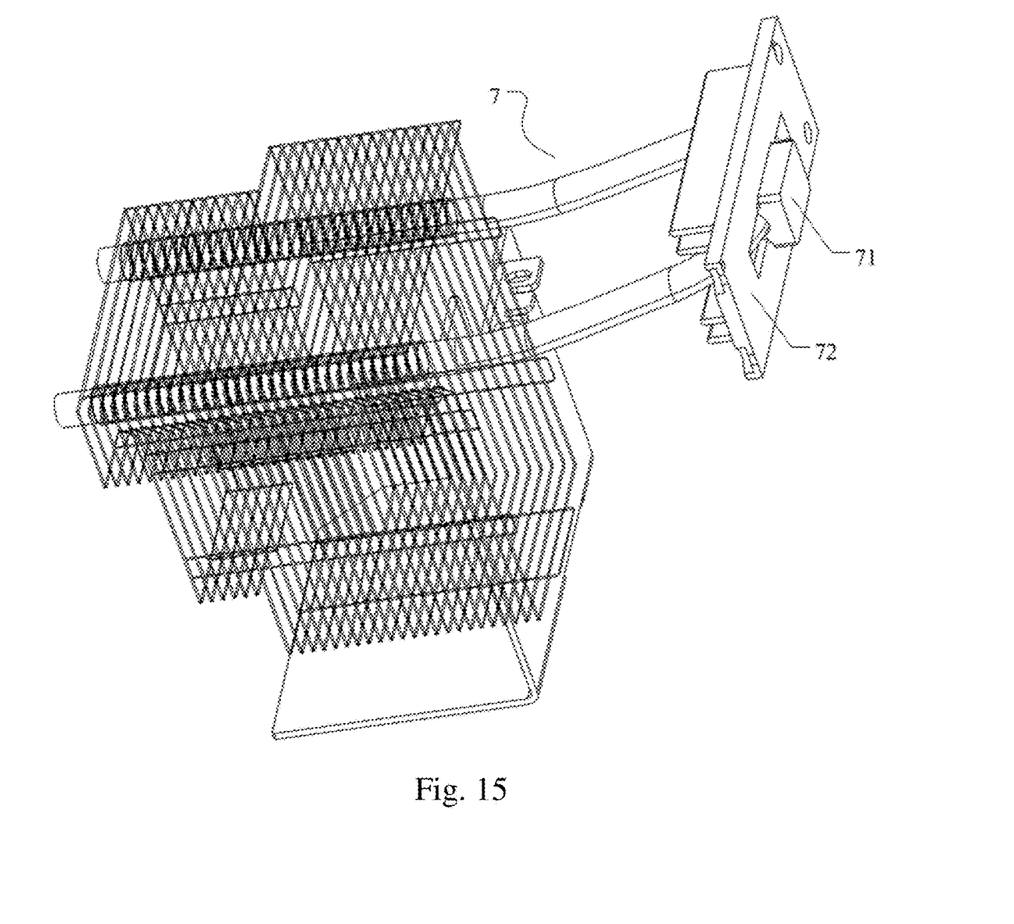
FIG. 15 is a structural schematic diagram of a heat sink in the DMD assembly illustrated in FIG. 11.

The heat sink 7 includes a cooling block 71, which protrudes the end face 72 of heat sink 7, wherein the end face 72 presses the mounting plate 5. A fourth through hole is provided on the end face 72, and the position of the fourth through hole corresponds to the position of the third through hole. Penetrating holes through which the cooling block 71 can go are provided on corresponding positions of the driver board 4, the mounting plate 5 and the base 2, so that the cooling block 71 could go through each penetrating hole to contact the back of the DMD chip 10 (the side which electrically connected to the driver board 4 through the conductive spring leaf). Alternatively, the cooling block 71 contacts the DMD chip 10 by conductive gel.

Figure 12:
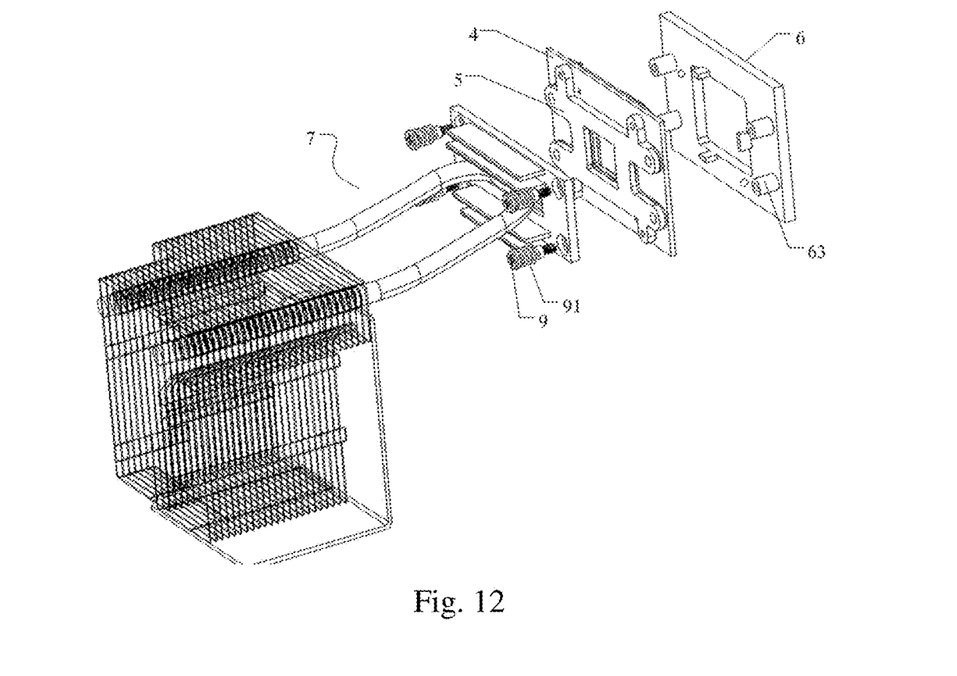
FIG. 12 is a schematic diagram of a dismantled structure of the DMD assembly illustrated in FIG. 11.
Figure 13:
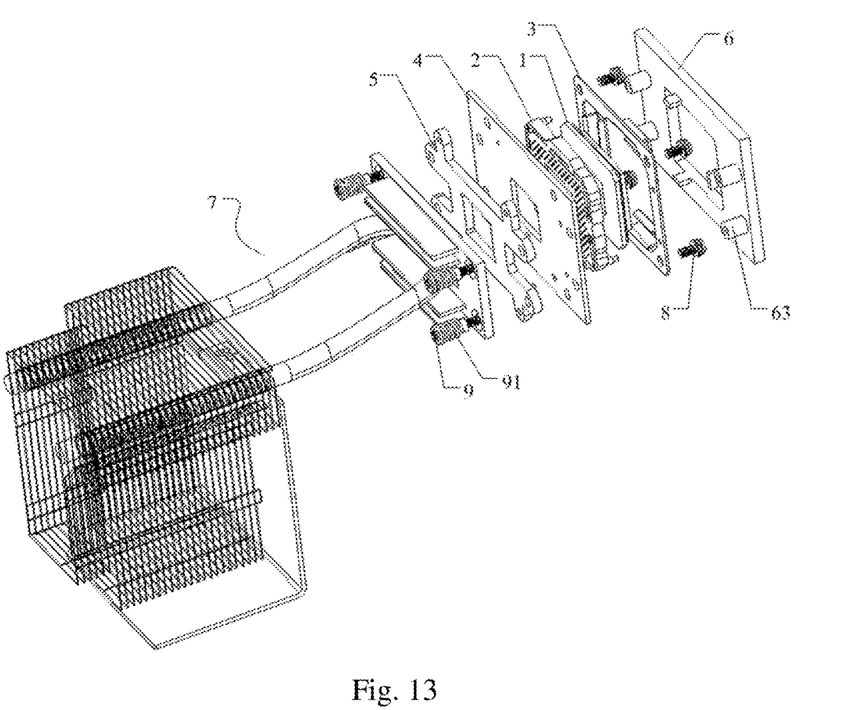
FIG. 13 is a schematic diagram of another dismantled structure of the DMD assembly illustrated in FIG. 11.

The heat sink 7 extends through the mounting plate 5 and the driver board 4, and rigidly connects to the heat sink connection plate 6 via a screw, such as a shoulder screw 9, as well as a spring 91 in cooperation with the shoulder screw 9, where a threaded stud 63 matching the should screw 9 is provided on the heat sink connection plate 6. This connection method avoids poor contact of contacts due to separation of the driver board 4 and the chip substrate 1 because of gravity of the heat sink 7, steadily fixing each relevant element, improving a product's quality and lowering defect rate of relevant products. Alternatively, four sets of shoulder screws 9, springs 91 and threaded studs 63 are evenly distributed on corresponding elements, respectively. The spring 91 is fitted to the shoulder screw 9, i.e., one end of the spring 91 abuts the nut of the shoulder screw 9. The diameter of the fourth through hole on the end face 72 is larger than the diameter of the third through hole on the mounting plate 5, so that the other end of the spring 91 extends through the end face 72 and abuts the mounting plate 5.

Figure 11:
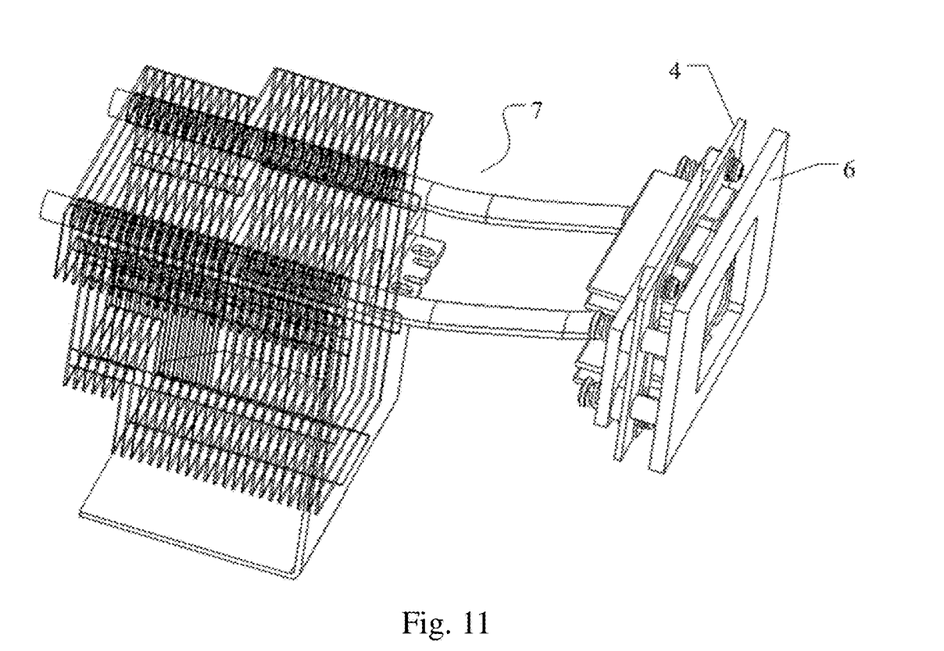
FIG. 11 is a structural schematic diagram of a DMD assembly according to another embodiment of the present disclosure.

Each element of the DMD assembly according to this embodiment could be assembled on the basis of the foregoing embodiment, for example:

Under the guidance of the locating columns 63 on the base 2 corresponding to the heat sink connection plate 6, inserting each inserting dowel 62 on the heat sink connection plate 6 into a corresponding inserting slot 12 on the chip substrate 1; subsequently, pressing the cooling block 71 on the heat sink 71 through penetrating holes on the mounting plate 5, driver board 4 and base 2 and against the back of the chip substrate 1; finally, screwing four composite structures each consisting of a shoulder screw 9 and a spring 91 into threaded studs 63 on the heat sink connection plate 6 through the heat sink 7, mounting plate 5 and driver board 4, so that relevant elements closely contact one another, which further leads to stable fixing and contact between elements, especially precise and stable contact between each contact on the chip substrate 1 and each contact on the driver board 4.

Alternatively, there are two sets of locating structures between the base 2 and the driver board 4, between the mounting plate 5 and the driver board 4 (fixing frame 3), and between the base 2 and the heat sink connection plate 6, respectively, each set including a locating column and a locating hole.

In some embodiments, a spring and a spring leaf are fitted to a should screw 9, where a first end of the spring leaf abuts the nut of the shoulder screw 9, a second end of the spring leaf abuts a surface area of the end face 72, wherein the surface area faces to the nut of the shoulder screw 91, the first end of the spring leaf locates between the nut of the shoulder screw 9 and a first end of the spring, and the other end of the spring abuts the mounting plate 5 through the fourth through hole on the end face 72.

Some embodiments provides another DMD assembly, the DMD assembly includes a chip substrate with a DMD chip, a heat sink connection plate, a driver board electrically connected to the chip substrate through contacts, a mounting plate and a heat sink, where the heat sink includes a cooling block, which protrudes from the end face of the heat sink contacting the mounting plate. Penetrating holes through which the cooling block penetrates, are provided on the driver board and the mounting plate, and the penetrating holes correspond to the side of the chip substrate facing the driver board; the cooling block penetrates through the penetrating holes on the mounting plate and the driver board to contact the side of the chip substrate facing the driver board. Any of the connections described in the foregoing embodiments, as well as any connection disclosed in related art could exist among the mounting plate, the driver board and the chip substrate.

Some embodiments provide a DMD assembly, which includes a base, a driver board, a chip substrate with a DMD chip and a fixing frame. Structures of the base, the driver board, the chip substrate and the fixing frame are similar to descriptions of these elements in foregoing embodiments, which will not be discussed here anymore. The DMD assembly also includes a heat sink, which includes a cooling block protruding from an end face of the heat sink contacting the driver board; penetrating holes through which the cooling block penetrates are provided on the driver board and the base, and the penetrating holes correspond to a side of the chip substrate facing the driver board; the cooling block contacts the side of the DMD chip facing the driver board through penetrating holes on the driver board and the base.

In the DMD assembly according to the present disclosure, a plurality of conductive spring leaves on the base extends from the mounting groove to contact a side of the driver board, inserting holes on the fixing frame facilitates the base's insertion into the fixing frame, and a plurality of elastic protrusions are provided on edges enclosing a side of the inserting hole. During installation, inserting the base holding the DMD chip from one side of the fixing frame into the fixing frame, and making the elastic protrusions on the other side of the fixing frame hook edges of the mounting groove of the base where the DMD chip is inserted and press the DMD chip, so that the DMD chip is steadily contained in the mounting groove and contacts the conductive spring leaf precisely and stably; then pressing the driver board against the side of the base opposite to the elastic protrusions, and fixing the driver board to the fixing frame or clamp the driver board between the fixing frame and the mounting plate with a fastener, so that the driver board contacts the conductive spring leaves on the base and electrically connects to the DMD chip in the mounting groove via the conductive spring leaves. In this way, the driver board and the DMD chip could be fixed and connected in a precise and stable manner, displacement and separation of the DMD chip, the driver board and respective corresponding conductive spring leaves (that is, contacts) are not likely to happen, contact between the DMD chip and the driver board is precise and stable, and assembly and dismantlement for DMD assembly are both convenient.

Moreover, the heat sink is rapidly connected to the heat sink connection plate through shoulder screws and springs fitted to the shoulder screws which extend through the mounting plate, the driver board and the fixing frame. An inserting dowel on the heat sink connection plate and a inserting slot matching the inserting dowel on the chip substrate could effectively prevent the cooling block from pushing the DMD chip because of forces from the heat sink or another element, thus avoiding poor contact and bad impact on a projected image due to separation of contacts on the DMD chip and contacts on the driver board, further improving precision and stability of contact between contacts on the DMD chip and contacts on the driver board, and improving quality of the projected image.

Moreover, there is interference contact between the elastic protrusions and the surface of the ceramic parts on the edge of the DMD chip, and the elastic protrusions press the DMD chip, so that the DMD chip is steadily held by the mounting groove and the DMD chip closely and stably contacts the conductive spring leaves after installation, which further improves precision and stability of contact of contacts on the DMD chip and contacts on the driver board; the fixing frame is made of elastic sheet metal material, because the elastic sheet metal material has a certain degree of elasticity, the elastic protrusions on the fixing frame would not crush or damage ceramic parts on edges of the DMD chip when pressing into edges of the mounting groove, ensuring integrity of relevant elements during installation, reducing installation difficulty and improving production efficiency as well as product quality.

In addition, DMD assemblies according to foregoing embodiments could be applied to a DLP optical engine and a DLP projection device, in other words, some embodiments of the present disclosure also provides a DLP optical engine and a DLP projection device, the DLP optical engine and DLP projection device includes a DMD assembly according to any of the foregoing embodiments, so that the DLP optical engine and DLP projection device applying the foregoing DMD assembly also have all the advantages of the foregoing DMD assembly.

In conclusion, embodiments of the present disclosure could not only ensure precision and stability of contact between the contacts on the DMD chip and the contacts on the driver board, improving the quality of the projected image, but reducing dismantlement difficulty and lowering requirements for the sizes of relevant structural elements as well, improving production efficiency and reducing production costs.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A DMD assembly comprising:
a base having opposite first and second sides;
a driver board;
a chip substrate including a DMD chip; and
a fixing frame, wherein:
the first side of the base includes a mounting groove configured to mount the chip substrate, and the second side of the base is attached to the driver board;
the base includes conductive spring leaves that extend through a bottom of the mounting groove and beyond the second side to electrically connect the chip substrate to the driver board through the conductive spring leaves;
the driver board includes a first through hole and the fixing frame includes a second through hole, a position of the first through hole corresponds to a position of the second through hole, and the driver board and the fixing frame are fixed together by a fastener extending through the first through hole and the second through hole;
the fixing frame includes an insertion hole, and the base is received in the insertion hole;
an elastic protrusion is positioned around the inserting hole on a side of the fixing frame facing away from the driver board;
the elastic protrusion comprises a fixing portion connected to the fixing frame and a pressing portion positioned on the fixing portion;
a surface of the pressing portion facing the chip substrate contacts the chip substrate to clamp the chip substrate against the base; and
a surface of the pressing portion facing a side wall of the mounting groove contacts the side wall of the mounting groove to cooperate with the insertion hole to confine a position of the base.

2. The DMD assembly according to claim 1, wherein the fixing portion comprises a supporting portion perpendicular to the fixing frame and a turning portion positioned on the supporting portion, wherein the turning portion extends to the insertion hole, and the pressing portion is positioned on a side of the turning portion facing the driver board.

3. The DMD assembly according to claim 1, wherein the elastic protrusion is integrally molded with the fixing frame.

4. The DMD assembly according to claim 1, wherein an interference contact is positioned between a surface of the pressing portion facing the chip substrate and a surface of the chip substrate.

5. The DMD assembly according to claim 1, wherein:
the DMD assembly further comprises a mounting plate, and the mounting plate includes a third through hole whose position corresponds to the position of the first through hole; and
the fastener fixes the mounting plate to a side of the driver board facing away from the fixing frame through the third through hole.

6. The DMD assembly according to claim 5, wherein:
a first locating column is positioned on a side of the mounting plate where the mounting plate is attached to the driver board; and
the driver board includes a first locating hole, and the first locating hole matches the first locating column.

7. The DMD assembly according to claim 1, wherein the second side includes a second locating column, the driver board includes a second locating hole, and the second locating hole matches the second locating column.

8. The DMD assembly according to claim 1, wherein the side wall of the mounting groove includes an elastic stopper, and the elastic stopper abuts an edge of the chip substrate to confine a position of the chip substrate.

9. The DMD assembly according to claim 1, wherein:
the DMD assembly further comprises a mounting plate and a heat sink;
the mounting plate is positioned on a side of the driver board facing away from the base, and the heat sink comprises a cooling block which protrudes from an end face of the heat sink;
the heat sink is attached to the mounting plate on the end face;
each of the driver board, the mounting plate and the base includes a penetrating hole through which the cooling block extends, and the penetrating hole corresponds to a side of the chip substrate facing the driver board; and the cooling block extends through the penetrating holes on the mounting plate, the driver board and the base and is attached to a side of the DMD chip facing the driver board.

10. The DMD assembly according to claim 9, wherein the cooling block is attached to the side of the chip substrate facing the driver board through a heat-conducting gel.

11. The DMD assembly according to claim 9, wherein the end face includes a third locating column, and the mounting plate includes a third locating hole matching the third locating column.

12. The DMD assembly according to claim 9, wherein:
the DMD assembly further comprises a heat sink connection plate and a first screw, a spring is fitted to the first screw, the end face includes a fourth through hole matching the spring, and each of the mounting plate and the driver board include a fifth through hole matching the first screw;
the heat sink connection plate includes a first convex column having an interior thread;
one end of the spring abuts a nut of the first screw, and the other end of the spring abuts the mounting plate through the fourth through hole on the end face; and
the first screw connects to a thread of the first convex column via the fourth through hole on the end face, the fifth through hole on the mounting plate and the fifth through hole on the driver board, and the fixing frame is located between the driver board and the heat sink connection plate.

13. The DMD assembly according to claim 12, wherein the heat sink connection plate includes an inserting dowel, and one edge of the chip substrate includes an inserting slot engaging with and matching the inserting dowel.

14. The DMD assembly according to claim 9, wherein:
the DMD assembly further comprises a heat sink connection plate and a second screw;
a spring and a spring leaf are fitted to the second screw;
the end face includes a six through hole matching the spring;
each of the mounting plate and the driver board includes a seventh through hole matching the second screw;
the heat sink connection plate includes a second convex column having an interior thread;
a first end of the spring leaf abuts a nut of the second screw, a second end of the spring leaf abuts a surface area of the end face facing the nut of the second screw, the first end of the spring leaf is located between the nut of the second screw and a first end of the spring, and the other end of the spring abuts the mounting plate through the sixth through hole on the end face; and
the second screw connects to a thread of the second convex column through the six through hole on the end face, the seventh through hole on the mounting plate and the seventh hole through on the driver board, and the fixing frame is located between the driver board and the heat sink connection plate.

15. The DMD assembly according to claim 14, wherein the heat sink connection board includes an inserting dowel, and one edge of the chip substrate includes an inserting slot matching and engaging with the inserting dowel.

16. The DMD assembly according to claim 1, wherein:
the DMD assembly further comprises a heat sink, the heat sink comprises a cooling block and the cooling block protrudes from an end face of the heat sink, and the heat sink is attached to the driver board on the end face;
each of the driver board and the base includes a penetrating hole through which the cooling block extends, and the penetrating hole corresponds to a side of the chip substrate facing the driver board; and
the cooling block extends through the penetrating holes on the driver board and the base and is attached to the side of the DMD chip facing the driver board.

17. A DLP projection device, comprising:
a DMD assembly, wherein the DMD assembly comprises:
a base having opposite first and second sides;
a driver board;
a chip substrate including a DMD chip; and
a fixing frame, wherein:
the first side of the base includes a mounting groove for mounting the chip substrate, and the second side of the base is attached to the driver board;
the base includes a conductive spring leaf that extends through a bottom of the mounting groove and beyond the second side to electrically connect the chip substrate to the driver board through the conductive spring leaf;
the driver board includes a first through hole and the fixing frame includes a second through hole;
a position of the first through hole corresponds to a position of the second through hole, and the driver board and the fixing frame are fixed by a fastener extending through the first through hole and the second through hole;
the fixing frame includes an insertion hole, and the base is received in the insertion hole;
an elastic protrusion is positioned around the insertion hole on a side of the fixing frame facing away from the driver board;
the elastic protrusion comprises a fixing portion connected to the fixing frame and a pressing portion positioned on the fixing portion;
a surface of the pressing portion facing the chip substrate contacts the chip substrate to clamp the chip substrate against the base; and
a surface of the pressing portion facing a side wall of the mounting groove contacts the side wall of the mounting groove to cooperate with the insertion hole to confine a position of the base.

18. The projection device according to claim 17, wherein:
the DMD assembly further comprises a heat sink, the heat sink comprises a cooling block and the cooling block protrudes from an end face of the heat sink, and the heat sink is attached to the driver board on the end face;
each of the driver board and the base includes a penetrating hole through which the cooling block extends goes, and the penetrating hole corresponds to a side of the chip substrate facing the driver board; and
the cooling block extends through the penetrating hole on the driver board and the penetrating hole on the base and is attached to the side of the DMD chip facing the driver board.

19. The projection device according to claim 17, wherein:
the DMD assembly further comprises a mounting plate and a heat sink, the mounting plate is provided on a side of the driver board facing away from the base, the heat sink comprises a cooling block that protrudes from an end face on the heat sink, and the heat sink is attached to the mounting plate on the end face;
each of the driver board, the mounting plate and the base includes a penetrating hole through which the cooling block extends, and the penetrating hole corresponds to a side of the chip substrate facing the driver board; and
the cooling block extends through the penetrating hole on the mounting plate, the penetrating hole on the driver board and the penetrating hole on the and is attached to a side of the DMD chip facing the driver board.

* * * * *